US012813281B2

(12) United States Patent
Kim et al.

(10) Patent No.: US 12,813,281 B2
(45) Date of Patent: Nov. 24, 2026

(54) SEMICONDUCTOR DEVICE COMPRISING A SHIELDING LAYER ON AN ENCAPSULANT AND METHOD FOR MAKING THE SAME

(71) Applicant: STATS ChipPAC Pte. Ltd., Singapore (SG)

(72) Inventors: ChangOh Kim, Incheon (KR); JinHee Jung, Incheon (KR)

( * ) Notice: Subject to any disclaimer, the term of this patent is extended or adjusted under 35 U.S.C. 154(b) by 463 days.

(21) Appl. No.: 18/482,849

(22) Filed: Oct. 7, 2023

(65) Prior Publication Data

US 2024/0120291 A1 Apr. 11, 2024

(30) Foreign Application Priority Data

Oct. 8, 2022 (CN) ........................ 202211222809.X

(51) Int. Cl.

| | |
|---|---|
| ***H10W 42/20*** | (2026.01) |
| ***H10P 74/20*** | (2026.01) |
| ***H10W 46/00*** | (2026.01) |
| ***H10W 74/01*** | (2026.01) |
| ***H10W 74/10*** | (2026.01) |

(52) U.S. Cl.

CPC ........... *H10W 42/20* (2026.01); *H10P 74/203* (2026.01); *H10W 46/00* (2026.01); *H10W 74/014* (2026.01); *H10W 74/114* (2026.01); *H10W 74/121* (2026.01); *H10W 46/501* (2026.01)

(58) Field of Classification Search

CPC ............... H01L 23/552; H01L 23/3121; H01L 23/3135; H01L 2223/5446; H01L 2223/54486; H01L 21/56; H01L 21/565; H10W 42/20; H10W 46/00; H10W 46/501; H10P 74/23

See application file for complete search history.

(56) References Cited

U.S. PATENT DOCUMENTS

| | | | | |
|---|---|---|---|---|
| 8,410,584 | B2 * | 4/2013 | An | H01L 24/97 257/659 |
| 10,629,565 | B2 * | 4/2020 | Jung | H01L 23/3107 |
| 2006/0272857 | A1 * | 12/2006 | Arnold | H05K 9/003 361/816 |
| 2011/0006408 | A1 * | 1/2011 | Liao | H01L 23/49805 257/E23.114 |
| 2014/0252595 | A1 * | 9/2014 | Yen | H01L 23/5389 257/737 |

(Continued)

FOREIGN PATENT DOCUMENTS

| | | |
|---|---|---|
| TW | 201834165 A | 9/2018 |
| TW | 201935626 A | 9/2019 |

*Primary Examiner* — Khiem D Nguyen

(74) *Attorney, Agent, or Firm* — .Junhe Law Office P.C.; Yi Zhang

(57) ABSTRACT

A semiconductor device and a method for making the same are provided. The method includes: providing a package including: a substrate including a top substrate surface and a bottom substrate surface; an electronic component mounted on the top substrate surface; and a first encapsulant disposed on the top substrate surface and encapsulating the electronic component; forming a fiducial mark in the first encapsulant; and forming a first shielding layer on the first encapsulant using an aerosol jetting apparatus, wherein the first shielding layer is at a predetermined distance from the fiducial mark and above the electronic component.

14 Claims, 7 Drawing Sheets

(56) References Cited

U.S. PATENT DOCUMENTS

| | | | | |
|---|---|---|---|---|
| 2015/0155248 | A1* | 6/2015 | Lin | H01L 21/56<br>257/737 |
| 2016/0286647 | A1* | 9/2016 | Hoang | H01L 21/481 |
| 2018/0108618 | A1* | 4/2018 | Yamamoto | H01L 23/3142 |

* cited by examiner

SEMICONDUCTOR DEVICE COMPRISING A SHIELDING LAYER ON AN ENCAPSULANT AND METHOD FOR MAKING THE SAME

TECHNICAL FIELD

The present application generally relates to semiconductor technology, and more particularly, to a semiconductor device and a method for making the same.

BACKGROUND OF THE INVENTION

The semiconductor industry is constantly faced with complex integration challenges as consumers want their electronics to be smaller, faster and higher performance with more and more functionalities packed into a single device. One of the solutions is System-in-Package (SiP). SiP can include multiple semiconductor components, e.g., semiconductor dice, semiconductor packages, integrated passive devices, and discrete active or passive electrical components, integrated together in a single semiconductor package. As high-speed digital and RF semiconductor packages may be integrated in SiPs, electromagnetic interference (EMI) may easily occur. EMI may interrupt, obstruct, or otherwise degrade or limit the performance of circuits in the SiPs.

Therefore, a need exists for reducing EMI in SiPs.

SUMMARY OF THE INVENTION

An objective of the present application is to provide a semiconductor device with reduced electromagnetic interference.

According to an aspect of embodiments of the present application, a method for making a semiconductor device is provided. The method may include: providing a package including: a substrate including a top substrate surface and a bottom substrate surface; an electronic component mounted on the top substrate surface; and a first encapsulant disposed on the top substrate surface and encapsulating the electronic component; forming a fiducial mark in the first encapsulant; and forming a first shielding layer on the first encapsulant using an aerosol jetting apparatus, wherein the first shielding layer is at a predetermined distance from the fiducial mark and above the electronic component.

According to another aspect of embodiments of the present application, a semiconductor device is provided. The semiconductor device may include: a substrate including a top substrate surface and a bottom substrate surface; an electronic component mounted on the top substrate surface; a first encapsulant disposed on the top substrate surface and encapsulating the electronic component; a fiducial mark formed in the first encapsulant; and a first shielding layer formed on the first encapsulant, wherein the first shielding layer is at a predetermined distance from the fiducial mark and above the electronic component.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

FIGS. 2A and 2B to FIGS. 5A and 5B and FIGS. 6-9 are cross-sectional views illustrating various steps of a method for making a semiconductor device according to an embodiment of the present application.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1:
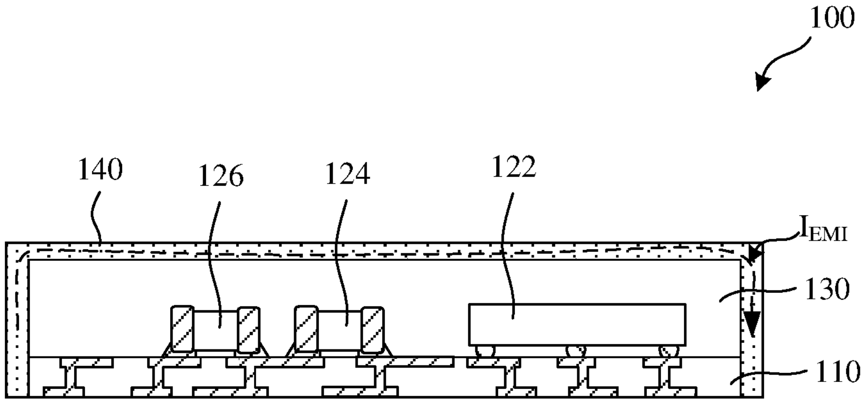
FIG. 1 is a cross-sectional view of a System-in-Package (SiP) device.

FIG. 1 illustrates a cross-sectional view of a System-in-Package (SiP) device 100, in which a conformal EMI shielding layer 140 is formed to prevent electromagnetic noises radiated by high-frequency devices. As shown in FIG. 1, the device 100 includes a substrate 110 and a plurality of electronic components 122, 124 and 126 mounted thereon.

The plurality of electronic components 122, 124 and 126 may include high speed digital and RF electronic devices, which may radiate to the outside electromagnetic noises. An encapsulant 130 is formed on the substrate 110 and encapsulates the electronic components 122, 124 and 126. The EMI shielding layer 140 is formed on the encapsulant 130 and coupled to a reference node or potential (e.g., ground), so as to inhibit electromagnetic waves generated in the device 100 from leaking to the outside, and also inhibit external electromagnetic waves from entering into the device 100.

However, as the EMI shielding layer 140 may form a closed-loop circuit with the ground, an EMI loop current IEMI may be generated and flow in the EMI shielding layer 140. The EMI loop current IEMI will further induce an electromagnetic field in its neighboring electrical components, thereby may generate undesired interference to the neighboring electrical components.

To address the above problem, a method for making a semiconductor device is provided in an aspect of the present application. In the method, a shielding layer is selectively formed between the conformal shielding layer and the electronic component to further reduce EMI in a SiP device. The combination of the selective shielding layer and the external conformal shielding layer can significantly reduce EMI or other interferences in the SiP. Moreover, in the method, a fiducial mark is first formed on an encapsulant above the electronic component, and then an aerosol jetting apparatus is employed to directly form the selective shielding layer relative to the fiducial mark. As no photolithography or etching process is used, the method of the present application is simple and cost-saving.

Referring to FIGS. 2A and 2B to FIGS. 5A-5B and FIGS. 6 to 9, perspective views and cross-sectional views illustrating various steps of a method for making a semiconductor device are shown. In the following, the method will be described with reference to the figures in more details.

Figure 2A:
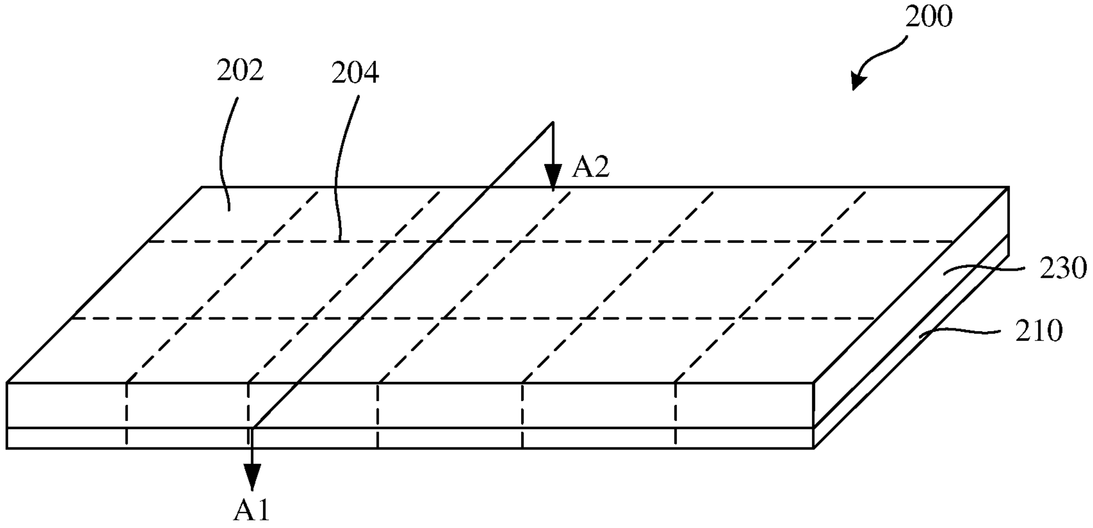
Figure 2B:
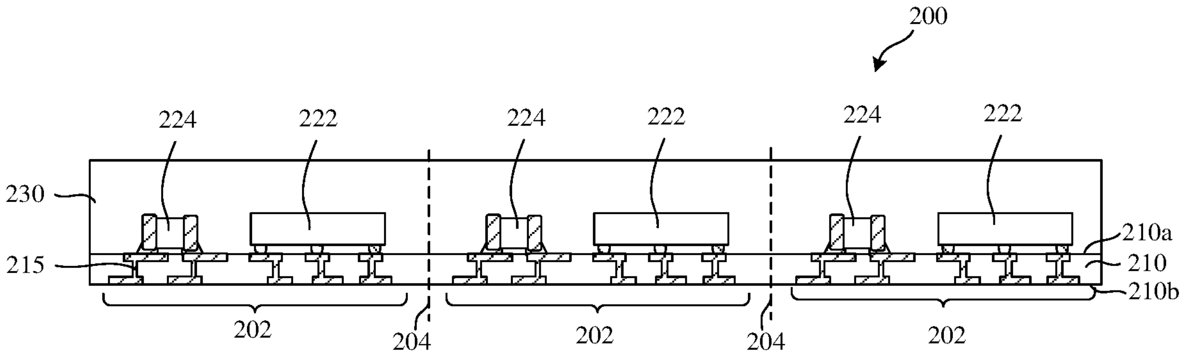

Referring to FIGS. 2A and 2B, a package strip 200 is provided. FIG. 2A illustrates a perspective view of the package strip 200, and FIG. 2B is a cross-sectional view of the package strip 200 along a section line A1-A2 shown in FIG. 2A.

In particular, the package strip 200 includes a substrate 210 having a top surface 210*a* and a bottom surface 210*b*. The substrate 210 can provide support and connectivity for electrical components and devices. By way of example, the substrate 210 can include a printed circuit board (PCB), a carrier substrate, a semiconductor substrate with electrical interconnections, or a ceramic substrate. However, the substrate 210 is not to be limited to these examples. In other examples, the substrate 210 may include a laminate interposer, a strip interposer, a leadframe, or other suitable substrates. The substrate 210 may include any structure on or in which an integrated circuit system can be fabricated. For example, the substrate 210 may include one or more insulating or passivation layers, one or more conductive vias formed through the insulating layers, and one or more conductive layers formed over or between the insulating layers. In the example shown in FIGS. 2B, the substrate 210 may include redistribution structures (RDSs) 215 having one or more dielectric layers and one or more conductive layers between and through dielectric layers. The conductive layers may define pads, traces and plugs through which electrical signals or voltages can be distributed horizontally and vertically across the RDS. The RDS 215 may include one or more of Al, Cu, Sn, Ni, Au, Ag, or any other suitable electrically conductive material. It could be appreciated that, the RDS 215 may be implemented in various structures and types, but aspects of the present application are not limited to the above example.

In the example shown in FIGS. 2A and 2B, the package strip 200 may include multiple unsingulated packages 202. The packages 202 may be predefined and separated by a plurality of singulation channels 204. The singulation channels 204 can provide cutting areas to singulate the package strip 200 into individual semiconductor packages. However, the scope of this application is not limited to the example shown in FIGS. 2A and 2B. In some other embodiments, the package strip 200 may include different packages.

In each package 202 shown in FIG. 2B, a plurality of electronic components 222 and 224 may be mounted on a top surface 210*a* of the substrate 210. The electronic components 222 and 224 may include any of a variety of types of semiconductor dice, semiconductor packages, or discrete devices. For example, the electronic components 222 and 224 may include a digital signal processor (DSP), a microcontroller, a microprocessor, a network processor, a power management processor, an audio processor, a video processor, an RF circuit, a wireless baseband system-on-chip (SoC) processor, a sensor, a memory controller, a memory device, an application specific integrated circuit, etc. The electronic components 222 and 224 may include one or more passive electrical components such as resistors, capacitors, inductors, etc. The electronic components 222 and 224 can be mounted on the substrate top surface 210*a* using any suitable surface mounting techniques.

In the present application, the electronic component 222 may contain devices or circuits that are susceptible to or generate electromagnetic interference (EMI), radio frequency interference (RFI), harmonic distortion, and inter-device interference. In some cases, the electronic component 222 may include any component that is configured to provide several mobile functionalities and capabilities, including but not limited to, positioning functionality, wireless connectivity functionality (e.g., wireless communication) and/or cellular connectivity functionality (e.g., cellular communication). In some cases, the electronic component 222 may be configured to provide a radio frequency front end (RFFE) functionality. For example, the electronic component 222 may include, but not limited to, a power amplifier, a filter, a switch, a low noise amplifier (LNA), a tuner, a multiplexer, etc. In FIG. 2B, the electronic component 222 is shown as a semiconductor die. The semiconductor die 222 is formed in a flip chip type and is mounted such that conductive bumps of the semiconductor die 222 are welded to some of the RDS 215 in the substrate 210. In other embodiments, the electronic component 222 may include bond pads and may be connected to the RDS 215 by wire bonding. The present application does not limit the connection relationship between the electronic component 222 and the RDS 215 to that disclosed herein.

A first encapsulant 230 is formed on the top surface 210*a* of the substrate 210 and encapsulates the electronic components 222 and 224. The first encapsulant 230 may be made of polymer composite material, such as epoxy resin with filler, epoxy acrylate with filler, or polymer with proper filler, but the scope of this application is not limited thereto. The first encapsulant 230 is non-conductive, provides structural support, and environmentally protects the electronic components 222 and 224 from external elements and contaminants.

Figure 3A:
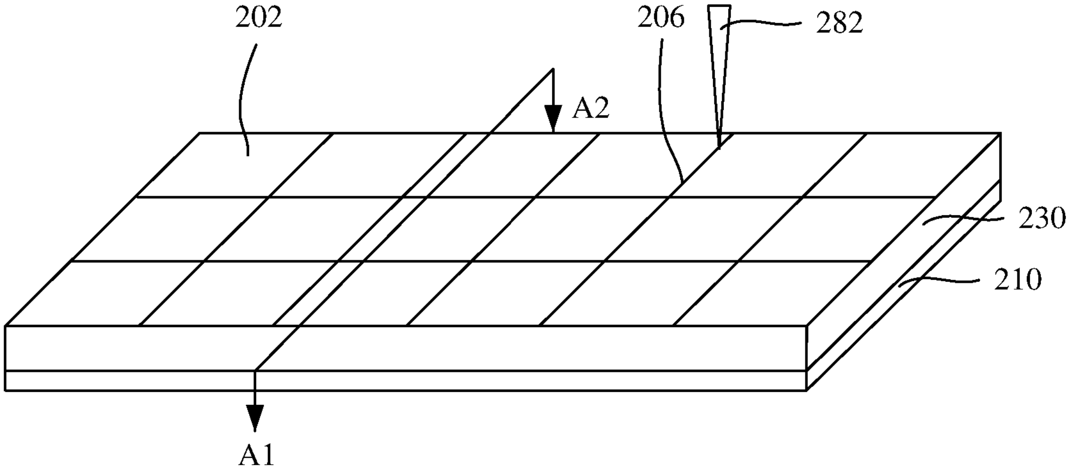
Figure 3B:
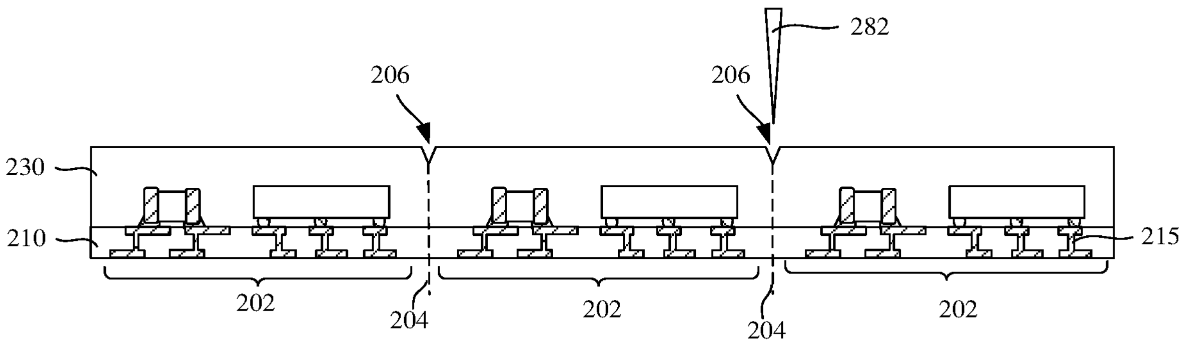

Referring to FIGS. 3A and 3B, a fiducial mark 206 is formed in the first encapsulant 230. FIG. 3A is a perspective view of the package strip after the fiducial mark 206 is formed, and FIG. 3B is a cross-sectional view of the package strip along the section line A1-A2 shown in FIG. 3A.

In some embodiments, a saw blade 282 may be used to form the fiducial mark 206. In some embodiments, a laser cutting tool or an etch process may be used to form the fiducial mark 206. In some embodiments, after the fiducial mark 206 is formed, a cleaning process for removing residuals may further be performed.

In the example shown in FIGS. 3A and 3B, the fiducial mark 206 may include a plurality of grooves each having a V-shaped cross section and aligned with respective singulation channels 204 in a vertical direction. In some embodiments, the groove may have a depth ranging from 5% to 80% of a thickness of the first encapsulant 230. It could be understood that the shape and/or the location of the fiducial mark shown in FIG. 3A and FIG. 3B are only for illustrative purpose and not limiting. In some other embodiments, the grooves may be formed in other peripheral areas of the package strip, or the grooves may have a U-shaped cross section, a hat-shaped cross section, a Y-shaped cross section, a rectangular cross section, a trapezoidal cross section, or other polygonal-shaped cross sections, as long as it is recognizable by an inspection tool such as an optical microscope, as will be elaborated below with more details. The location of the fiducial mark 206 can be determined with reference to the singulation channels. In some other embodiments, more than one fiducial marks 206 may be formed on the surface of the first encapsulant 230.

Figure 4A:
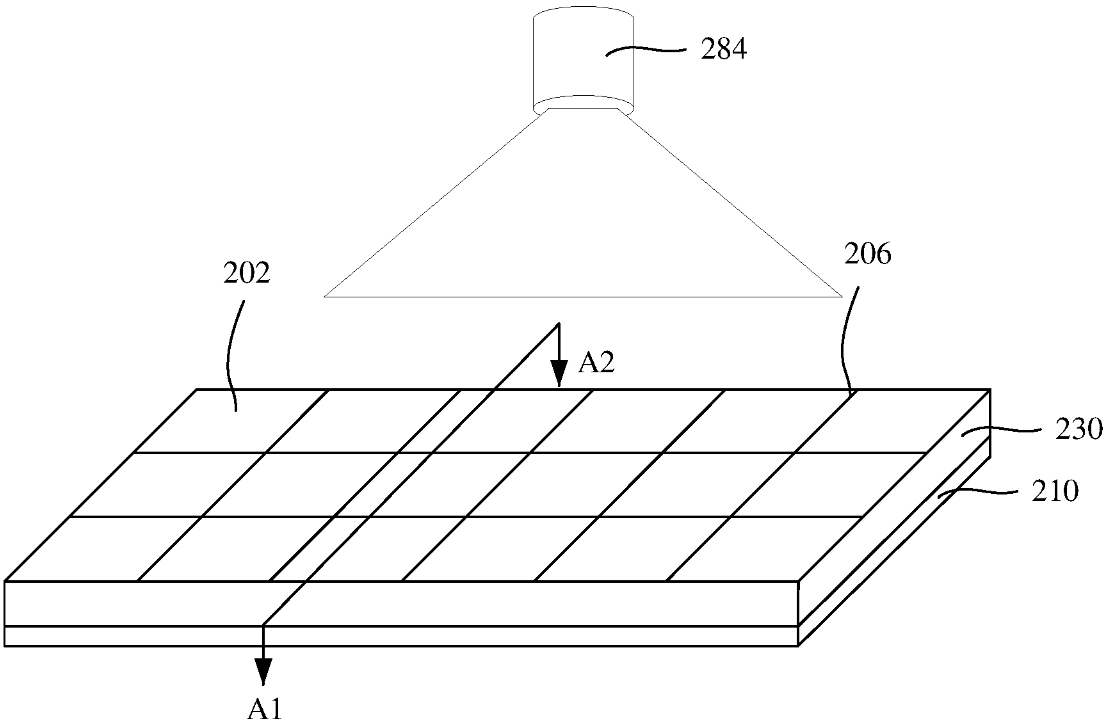
Figure 4B:
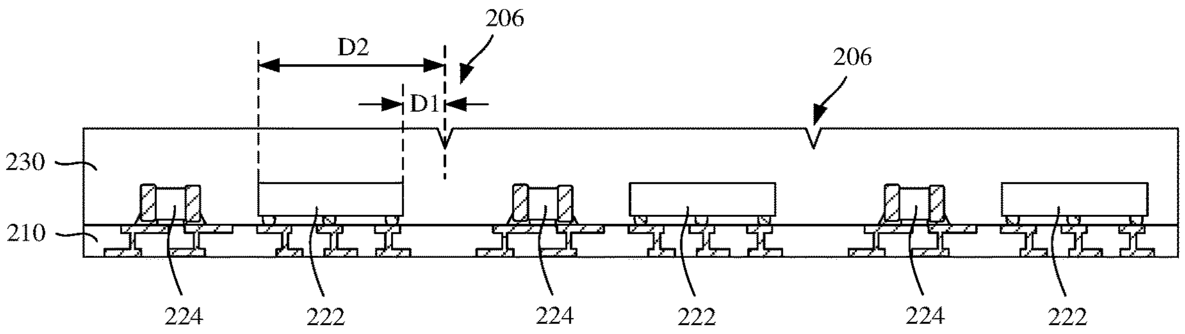

Referring to FIGS. 4A and 4B, a vision inspection apparatus 284 is used to inspect the package to determine a location of the fiducial mark 206 and a distance between the fiducial mark 206 and the electronic component 222. FIG. 4A is a perspective view of the package strip, and FIG. 4B is a cross-sectional view of the package strip along the section line A1-A2 shown in FIG. 4A. The visual inspection apparatus 284 may include an optical microscope, an electron microscope, or an x-ray microscope, but the present application is not limited thereto.

In some embodiments, as shown in FIG. 4B, the electronic component 222 may include a proximal end and a distal end relative to the fiducial mark 206. The vision inspection apparatus 284 can be used to determine a distance D1 between the proximal end of the electronic component 222 and the fiducial mark 206, and another distance D2 between the distal end of the electronic component 222 and the fiducial mark 206. The two distances D1 and D2 can be used to determine a position of a selective shielding layer formed above the electronic component 222 in a subsequent process.

In some embodiments, the vision inspection apparatus 284 can take an image of the top surface of the first encapsulant 230, and then an image recognition algorithm can be implemented by the vision inspection apparatus 284 or an external controller to automatically detect and recognize the electronic component 222, the fiducial mark 206, and/or a positional relationship therebetween.

Figure 5A:
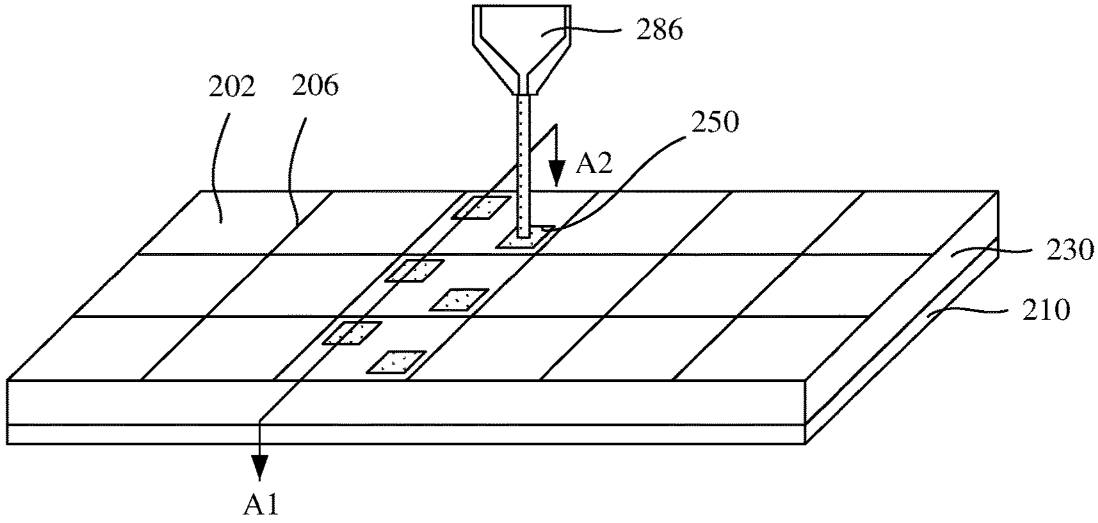
Figure 5B:
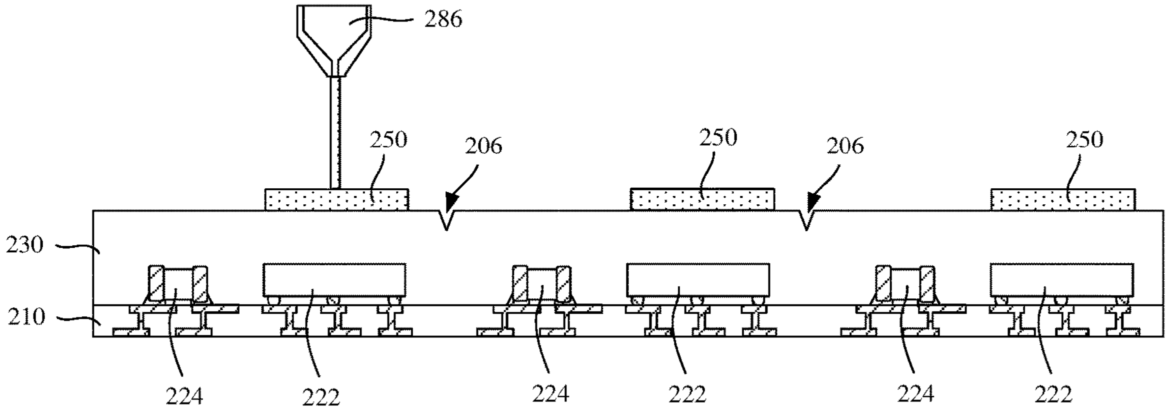

Referring to FIGS. 5A and 5B, a first shielding layer 250 is formed on the first encapsulant 230 using an aerosol jetting apparatus 286. FIG. 5A is a perspective view of the package strip after forming the first shielding layer 250, and FIG. 5B is a cross-sectional view of the package strip along the section line A1-A2 shown in FIG. 5A.

In some embodiments, the aerosol jetting apparatus 286 can atomize a conductive ink (for example, a silver-based conductive ink, etc.) via ultrasonic or pneumatic means, so as to produce droplets on the order of one to more micrometers in diameter. The droplets may be entrained in a gas stream and delivered to a print head. At the print head, another gas flow may be introduced to focus the droplets into a tightly collimated beam of material. Then, the combined gas streams may fly out of the print head through a converging nozzle that compresses the aerosol stream to particles or droplets with a small diameter. Then, the jet of droplets may fly out of the print head at a high velocity and impinges upon the first encapsulant 230. In this way, at least a portion of the top surface aligned with the nozzle can be deposited with the shielding material. Furthermore, the first shielding layer 250 can be formed by moving the print head and continuously dispensing the droplets. In some embodiments, the aerosol jetting apparatus 286 may further include a control device (e.g., a micro controller unit) for controlling its operations. For example, the control device can control the movement of the print head, and/or a dispensing time of the jet of droplets based on the location of the fiducial mark 206 and the distance between the fiducial mark 206 and the electronic component 222. In some embodiments, a post-treatment (for example, a post-heating process) may be performed on the first shielding layer 250 to attain its final electrical and mechanical properties.

In some embodiments, the aerosol jetting apparatus may include multiple print heads. Thus, the multiple print heads can operate simultaneously above the package strip to form multiple first shielding layers above respective semiconductor devices, such that the productivity of the aerosol jetting apparatus can be increased.

Continuing referring to FIG. 5B, the first shielding layer 250 is formed at a predetermined distance from the fiducial mark 206 and above the electronic component 222, which may be susceptible to or generate EMI, RFI, etc. As can be seen, a projection of the first shielding layer 250 onto the top surface of the substrate 210 overlaps with the electronic component 222, and preferably covers the entirety of the electronic component 222, and thus the first shielding layer 250 can shield EMI or other interferences induced to (or generated by) the electronic component 222.

Moreover, as the aerosol jetting apparatus 286 can easily and accurately control the position and/or the dispensing time of the jet of droplets based on the location of the fiducial mark 206, the first shielding layer 250 can be directly formed at a desired area with a desired shape without any mask, any photolithography process, or any etching process. Accordingly, compared with a method in which laser ablation, sputtering and grinding processes are used to forming a selective shielding layer, the method of the present application is simple and cost-saving.

However, the scope of this application is not limited to the embodiment described above. In some other embodiments, the first shielding layer may be dispensed, sprayed or printed on the first encapsulant by jet printing, laser printing, pneumatically, or any other metal deposition process, which can form the first shielding layer directly at a desired area with a desired shape.

Figure 6:
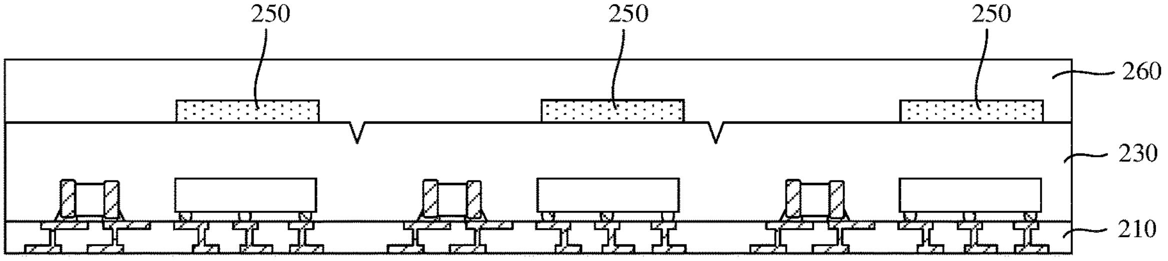

Afterwards, as shown in FIG. 6, a second encapsulant 260 is formed on the first encapsulant 230 and the first shielding layer 250. For example, the second encapsulant 260 can be formed on the first encapsulant 230 and the first shielding layer 250 using a paste printing, compressive molding, transfer molding, liquid encapsulant molding, vacuum lamination, spin coating, or other suitable process. The second encapsulant 260 may be made of polymer composite material, such as epoxy resin with filler, epoxy acrylate with filler, or polymer with proper filler, but the scope of this application is not limited thereto. For example, the second encapsulant 260 may include an epoxy molding compound filled with one or more high-k dielectric materials. The high-k fillers can improve thermal conductivity of the second encapsulant 260.

Figure 7:
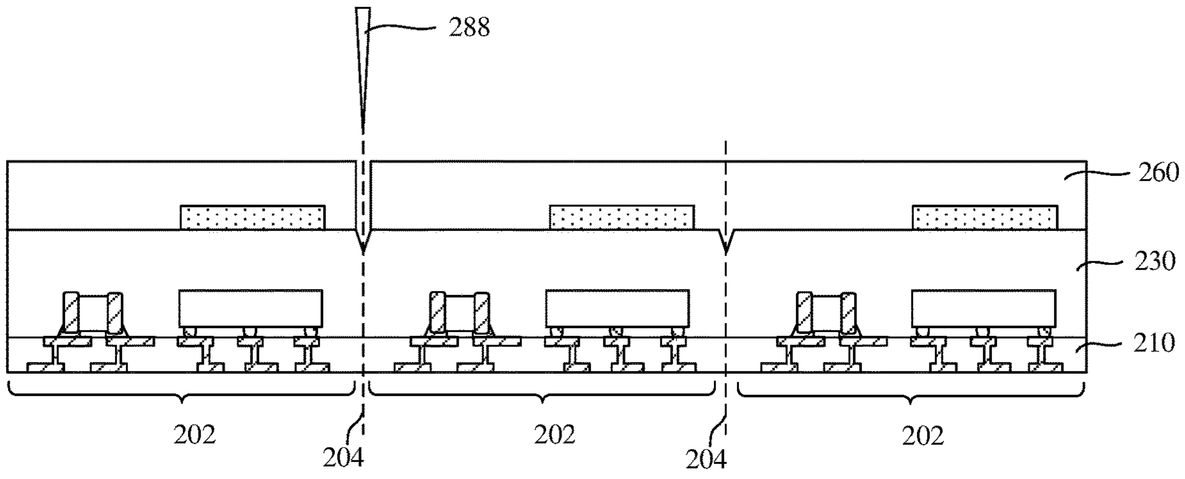

Afterwards, as shown in FIG. 7, each semiconductor device 202 is singulated from the package strip along the respective singulation channel 204. For example, as shown in FIG. 7, the package strip can be singulated into individual devices through the singulation channels 204 using a saw blade 288. In some other examples, a laser cutting tool can also be used to singulate the package strip.

Figure 8:
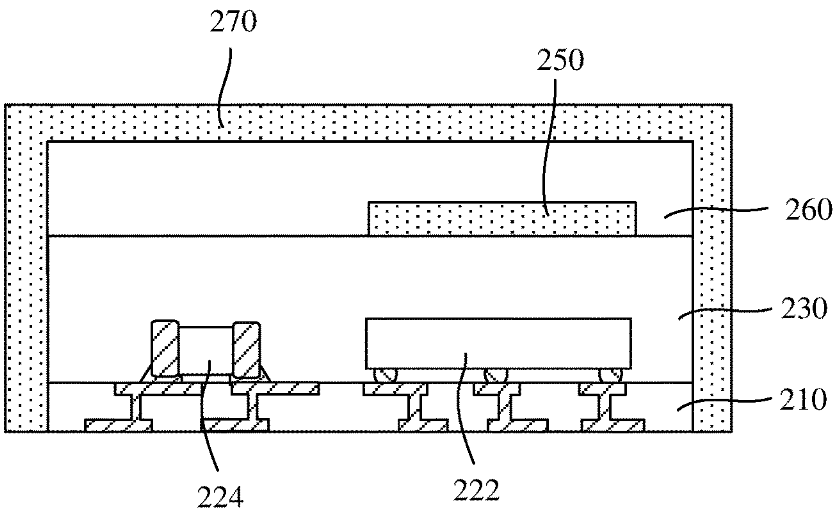

Afterwards, as shown in FIG. 8, a second shielding layer 270 is formed to cover the semiconductor device. The second shielding layer 270 may be made of the same material as or a different material from the first shielding layer 250, and may be formed by spray coating, plating, sputtering, or any other suitable metal deposition process.

The second shielding layer 270 may be a conformal shield that follows the shapes and/or contours of the second encapsulant 260, the first encapsulant 230 and the substrate 210. That is, the second shielding layer 270 covers the top and lateral surfaces of the second encapsulant 260, the lateral surface of the first encapsulant 230, and the lateral surface of the substrate 210. Thus, the combination of the first shielding layer 250 and the second shielding layer 270 can significantly reduce EMI or other interferences in the semiconductor device.

Figure 9:
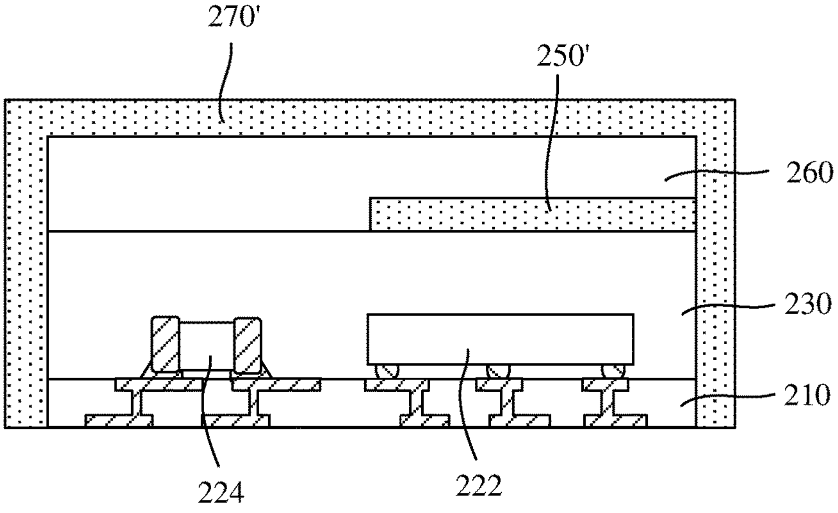

In the example shown in FIG. 8, the second shielding layer 270 may not be connected to the first shielding layer 250 thereunder, as the first shielding layer 250 is formed away from singulation channel. However, the present application is not limited thereto. In another example as shown in FIG. 9, the first shielding layer 250' may be formed at a singulation channel. Consequently, a portion of a lateral surface of the first shielding layer 250' can be exposed from the second encapsulant 260 after the singulation process, and the second shielding layer 270' may cover the exposed portion of the lateral surface of the first shielding layer 250' and thus be in electrical contact with the first shielding layer 250'.

While the processes for making the semiconductor device are illustrated in conjunction with corresponding figures, it will be understood by those skilled in the art that modifications and adaptations to the process may be made without departing from the scope of the present invention.

Figure 10:
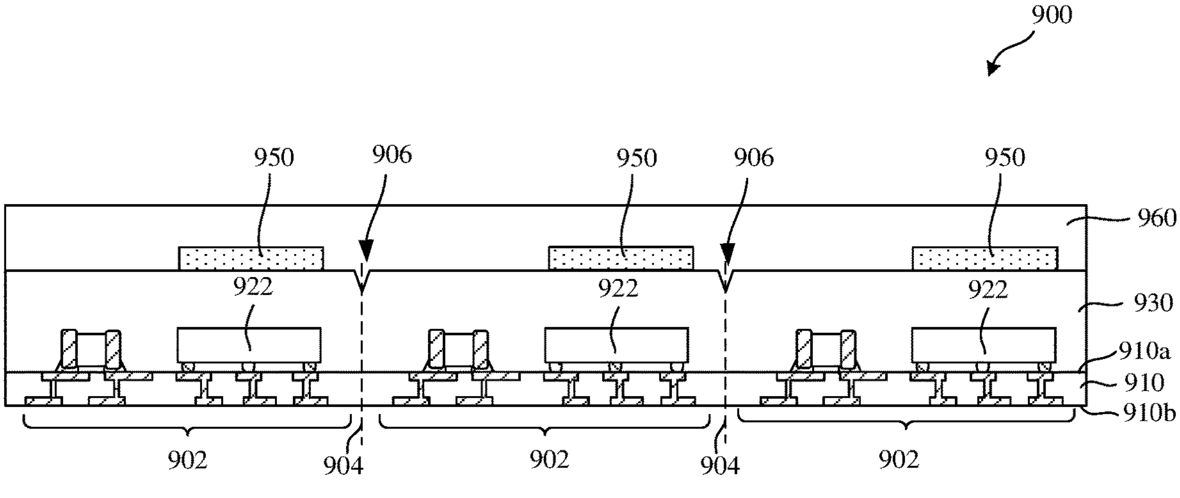
FIG. 10 is a cross-sectional view of a semiconductor device according to an embodiment of the present application.

According to another aspect of the present application, a semiconductor device is provided. Referring to FIG. 10, a cross-sectional view of a semiconductor device 900 is illustrated according to an embodiment of the present application.

As shown in FIG. 10, the semiconductor device 900 includes a substrate 910, an electronic component 922, a first encapsulant 930, a fiducial mark 906 and a first shielding layer 950. The substrate 910 may have a top surface 910*a* and a bottom surface 910*b*. The electronic component 922 is mounted on the top surface 910*a* of the substrate 910, and may be susceptible to or generate electromagnetic interference (EMI), radio frequency interference (RFI), harmonic distortion, and inter-device interference. The first encapsulant 930 is disposed on the surface 910*a* of the substrate 910 and encapsulates the electronic component 922. The fiducial mark 906 is formed in the first encapsulant 930. The first shielding layer 950 is formed on the first encapsulant 930, and the first shielding layer 950 is at a predetermined distance from the fiducial mark 906 and above the electronic component 922.

In some embodiments, a projection of the first shielding layer 950 onto the top surface 910*a* of the substrate 910 may cover the electronic component 922, and thus the first shielding layer 950 can shield EMI or other interferences induced to (or generated by) the electronic component 922.

In some embodiments, the fiducial mark 906 may include a groove formed in the first encapsulant 930 at a singulation channel 904 of the substrate 910. The singulation channels 904 can provide cutting areas to singulate the substrate 910 into individual semiconductor devices 902.

In some embodiments, as shown in FIG. 10, a second encapsulant 960 is formed on the first encapsulant 930 and covers the fiducial mark 906 and the first shielding layer 950. In some embodiments, the second encapsulant 960 may include an epoxy molding compound filled with one or more high-k dielectric materials. The high-k fillers can improve thermal conductivity of the second encapsulant 960.

In some other embodiments, the semiconductor device 900 may have a structure and configuration similar to the package shown in FIG. 6 and made by the above method embodiments. Thus, more details of the semiconductor device 900 can be found in the above method embodiments, and will not be elaborated herein.

The discussion herein included numerous illustrative figures that showed various portions of a semiconductor device and a method of manufacturing thereof. For illustrative clarity, such figures did not show all aspects of each example assembly. Any of the example devices and/or methods provided herein may share any or all characteristics with any or all other devices and/or methods provided herein. It could be understood that embodiments described in the context of one of the devices or methods are analogously valid for the other devices or methods. Similarly, embodiments described in the context of a device are analogously valid for a method, and vice versa. Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A method for making a semiconductor device, comprising:

providing a package comprising:

a substrate comprising a top substrate surface and a bottom substrate surface;

an electronic component mounted on the top substrate surface; and a first encapsulant disposed on the top substrate surface and encapsulating the electronic component;

forming a fiducial mark in the first encapsulant;

inspecting the package to determine a location of the fiducial mark and a distance between the fiducial mark and the electronic component; and forming a first shielding layer at a predetermined distance from the fiducial mark on the first encapsulant based on the location of the fiducial mark and the distance between the fiducial mark and the electronic component, wherein the first shielding layer is above the electronic component.

2. The method of claim 1, wherein forming the fiducial mark in the first encapsulant comprises:

forming a groove in the first encapsulant at a singulation channel of the package.

3. The method of claim 2, wherein forming the groove in the first encapsulant comprising:

forming the groove in the first encapsulant using a saw blade or a laser cutting tool.

4. The method of claim 1, wherein forming the first shielding layer on the first encapsulant comprising:

forming the first shielding layer on the first encapsulant using an aerosol jetting apparatus.

5. The method of claim 4, wherein forming the first shielding layer on the first encapsulant using the aerosol jetting apparatus comprising:

controlling the aerosol jetting apparatus to form the first shielding layer based on the location of the fiducial mark and the distance between the fiducial mark and the electronic component.

6. The method of claim 1, wherein a projection of the first shielding layer onto the top substrate surface covers the electronic component.

7. The method of claim 1, further comprising:

forming a second encapsulant on the first encapsulant to cover the fiducial mark and the first shielding layer;

singulating the semiconductor device from the package along a singulation channel of the package; and forming a second shielding layer to cover the semiconductor device.

8. The method of claim 7, wherein the second shielding layer conforms to a shape of the semiconductor device.

9. The method of claim 7, wherein the second encapsulant comprises an epoxy molding compound filled with one or more high-k dielectric materials.

10. A semiconductor device, comprising:

a substrate comprising a top substrate surface and a bottom substrate surface;

an electronic component mounted on the top substrate surface;

a first encapsulant disposed on the top substrate surface and encapsulating the electronic component;

a fiducial mark formed in the first encapsulant; and a first shielding layer formed at a predetermined distance from the fiducial mark on the first encapsulant based on the location of the fiducial mark and the distance between the fiducial mark and the electronic component, wherein the first shielding layer is above the electronic component.

11. The semiconductor device of claim 10, wherein the fiducial mark comprises a groove formed in the first encapsulant at a singulation channel of the substrate.

12. The semiconductor device of claim 10, wherein a projection of the first shielding layer onto the top substrate surface covers the electronic component.

13. The semiconductor device of claim 10, further comprising:

a second encapsulant formed on the first encapsulant and covering the fiducial mark and the first shielding layer.

14. The semiconductor device of claim 13, wherein the second encapsulant comprises an epoxy molding compound filled with one or more high-k dielectric materials.

* * * * *